United States Patent
Li et al.

(10) Patent No.: US 11,160,193 B2
(45) Date of Patent: Oct. 26, 2021

(54) SHRINKING DEVICE FOR LIQUID COOLING SYSTEM AND THE LIQUID COOLING SYSTEM HAVING THE SAME

(71) Applicant: Beijing Deepcool Industries Co., Ltd., Beijing (CN)

(72) Inventors: Weichao Li, Beijing (CN); Qiuchen Zhang, Beijing (CN); Lei Liu, Beijing (CN)

(73) Assignee: Beijing Deepcool Industries Co., Ltd., Beijing (CN)

( * ) Notice: Subject to any disclaimer, the term of this patent is extended or adjusted under 35 U.S.C. 154(b) by 125 days.

(21) Appl. No.: 16/391,599

(22) Filed: Apr. 23, 2019

(65) Prior Publication Data
US 2019/0254193 A1    Aug. 15, 2019

Related U.S. Application Data

(63) Continuation of application No. PCT/CN2018/087118, filed on May 16, 2018.

(30) Foreign Application Priority Data

Aug. 10, 2017    (CN) .......................... 201710679633.3

(51) Int. Cl.
| | |
|---|---|
| F28D 15/00 | (2006.01) |
| H05K 7/20 | (2006.01) |
| G06F 1/20 | (2006.01) |
| F01P 11/18 | (2006.01) |
| F01P 11/02 | (2006.01) |

(Continued)

(52) U.S. Cl.
CPC ........ *H05K 7/20272* (2013.01); *F01P 11/029* (2013.01); *F01P 11/18* (2013.01); *F28D 21/00* (2013.01); *F28F 1/006* (2013.01); *F28F 9/26* (2013.01); *F28F 9/262* (2013.01); *F28F 11/00* (2013.01); *G06F 1/20* (2013.01); *H01L 23/427* (2013.01); *F01P 2011/0233* (2013.01); *F28D 2021/0029* (2013.01); *F28F 9/026* (2013.01);
(Continued)

(58) Field of Classification Search
CPC ..... H05K 7/20272; F01P 11/029; F01P 11/18; F01P 2011/0233; F01P 11/0285; F28D 21/00; F28D 2021/0029; F28F 1/006; F28F 9/26; F28F 9/262; F28F 11/00; F28F 2265/12; F28F 2275/20; F28F 9/0231; G06F 1/20; G06F 2200/201; H01L 23/427

See application file for complete search history.

(56) References Cited

U.S. PATENT DOCUMENTS

| | | | |
|---|---|---|---|
| 8,459,337 B2 * | 6/2013 | Seidler .................... | F28F 19/01 165/81 |
| 9,846,001 B2 * | 12/2017 | Ask ......................... | F28F 27/00 |

FOREIGN PATENT DOCUMENTS

| | | |
|---|---|---|
| CN | 204680663 U | 9/2015 |
| CN | 205315104 U | 6/2016 |

(Continued)

*Primary Examiner* — Henry T Crenshaw
*Assistant Examiner* — Kamran Tavakoldavani
(74) *Attorney, Agent, or Firm* — The Webb Law Firm

(57) ABSTRACT

A shrinking device and a liquid cooling system are provided. The shrinking device includes a housing, and a shrinking bag at least partially inserted into the housing. The shrinking bag is in communication with the outside atmosphere through a vent hole. The shrinking device according to the present invention can solve the liquid leakage problem caused by excessive pressure inside the system.

16 Claims, 11 Drawing Sheets

(51) Int. Cl.
*F28F 9/26* (2006.01)
*H01L 23/427* (2006.01)
*F28F 11/00* (2006.01)
*F28F 1/00* (2006.01)
*F28D 21/00* (2006.01)
*F28F 9/02* (2006.01)

(52) U.S. Cl.
CPC ....... *F28F 2265/12* (2013.01); *F28F 2275/20* (2013.01); *G06F 2200/201* (2013.01)

(56) References Cited

FOREIGN PATENT DOCUMENTS

| | | | |
|---|---|---|---|
| CN | 107339902 | A | 11/2017 |
| CN | 207214885 | U | 4/2018 |
| JP | 6144449 | A | 3/1986 |
| JP | 8166100 | A | 6/1996 |

\* cited by examiner

SHRINKING DEVICE FOR LIQUID COOLING SYSTEM AND THE LIQUID COOLING SYSTEM HAVING THE SAME

CROSS REFERENCE TO RELATED APPLICATIONS

This application is a United States continuation application of International Application No. PCT/CN2018/087118 filed May 16, 2018, and claims priority to Chinese Patent Application No. 201710679633.3 filed Aug. 10, 2017, the disclosures of which are hereby incorporated by reference in their entirety.

TECHNICAL FIELD

The present invention relates to the field of heat dissipation of computers, in particular to a shrinking device for a liquid cooling system and the liquid cooling system having the same.

BACKGROUND ART

A liquid cooling system in a computer generally forms a sealed structure, in which the coolant circulates. When the system runs in a high-temperature environment for a period of time, the interior of the system is in a high-pressure state. When the pressure reaches a certain value, leakage may occur at the weak part of the sealing portion. To solve the leakage problem, many traditional methods depend on improving the sealing reliability or increasing the internal pressure resistance of the system to avoid the leakage. However, the current liquid cooling system has the following disadvantages:
1. Although the leakage rate can be reduced by the advanced manufacturing process, there is still a certain proportion of leakage risk, causing the computer hardware to burn out.
2. Because the interior of the system is in a high-pressure state for a long time, components such as sealing rings a can be in a fatigue state for a long time. The probability of leakage can become higher as time goes by.
3. Simply enhancing sealing results in system redundancy and increased cost, as well as many limitations to design and manufacture.

The information disclosed in the background art is intended merely to provide better understanding of the general background of the invention and should not be taken as an admission or any suggestion in any form that such information constitutes prior art known to those skilled in the art.

SUMMARY OF THE INVENTION

An object of the present invention is to provide a shrinking device for a liquid cooling system to solve the liquid leakage problem caused by excessive pressure inside the system.

To this end, the present invention provides a shrinking device for a liquid cooling system, comprising: a housing internally provided with a chamber, wherein coolant flows through the chamber; and at least one shrinking bag having an open end and a closed end, the closed end being inserted into the chamber, and the shrinking bag being communicated with the atmosphere through a vent hole.

In some embodiments, gap is provided between the shrinking bag and the inner wall of the housing.

Another aspect of the present invention discloses a liquid cooling system, comprising: a heat exchanger radiator through which coolant dissipates heat; a cooling block provided with a water pump, wherein the liquid cooling system absorbs heat through the cooling block and transfers the heat to the heat exchanger radiator through the water pump; and the shrinking device mentioned above.

In some embodiments, the shrinking device further comprises a sealing member disposed at an open end of the shrinking bag and mounted to the housing, wherein the sealing member has the vent hole therein such that the shrinking bag is communicated with the outside atmosphere through the vent hole.

According to the present disclosure, when the internal pressure of the computer is too high, the coolant squeezes the shrinking bag to expand the internal volume of the coolant, so that the increased pressure is released and the liquid leakage is fundamentally solved. Meanwhile, the liquid cooling system according to the present disclosure has the advantages of little change in appearance and size, low cost and easiness in maintenance.

DETAILED DESCRIPTION OF THE INVENTION

Specific embodiments of the present invention will be described in detail with reference to the accompanying drawings, but it should be understood that the scope of the present invention is not limited to the specific embodiments.

The term "comprise", or variations thereof such as "comprises" or "comprising" throughout the specification and claims, will be understood to imply the inclusion of a stated element or component but not the exclusion of other elements or components, unless expressly stated otherwise.

Example 1

Figure 1:
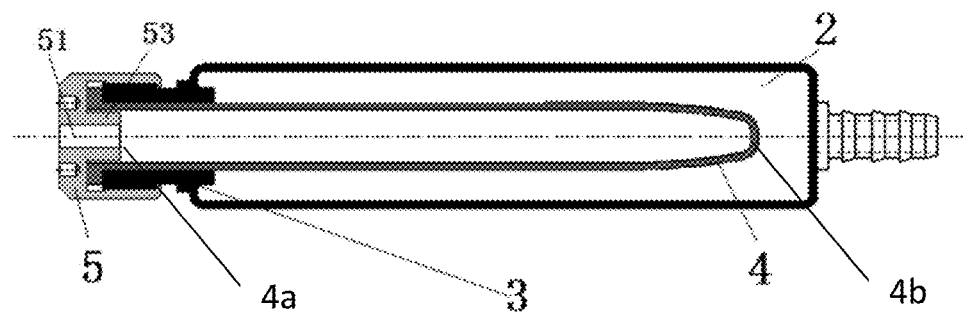
FIG. 1 is a schematic view showing a structure of a shrinking device for a liquid cooling system according to the present invention.

As shown in FIG. 1, a shrinking device for a CPU liquid cooling system according to an embodiment of the present invention includes a housing 2 which has a chamber in communication with the coolant circulated in the CPU liquid cooling system, and at least one shrinking bag 4 arranged inside the housing 2. The shrinking bag 4 has an open end 4a and a closed end 4b, and the closed end 4b is inserted into the chamber. The shrinking bag 4 is in communication with the outside atmosphere through a vent hole 51.

Figure 3:
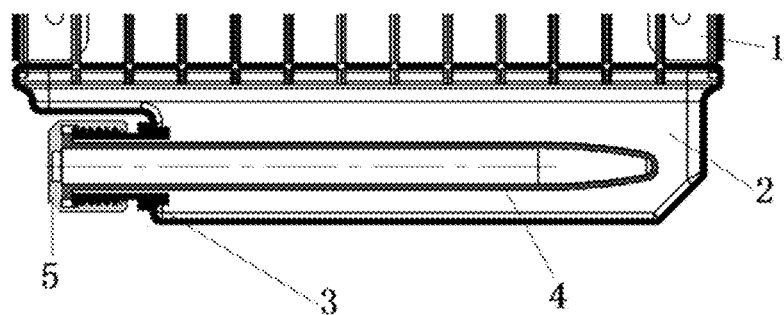
FIG. 3 is a schematic view showing a conventional state of a liquid cooling system according to the present invention.
Figure 4:
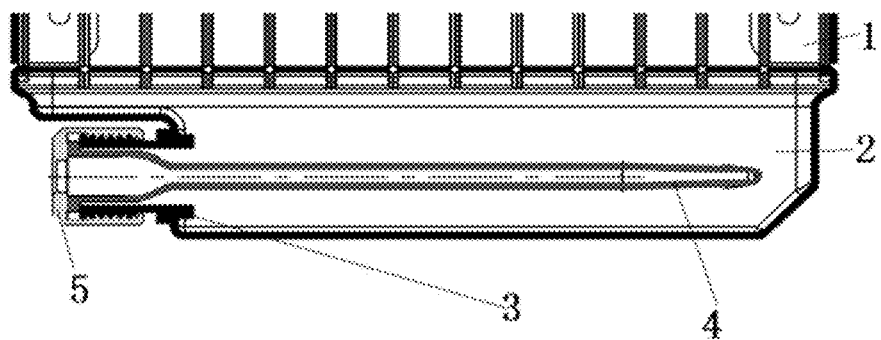
FIG. 4 is a schematic view showing a decompression state of a liquid cooling system according to the present invention.

In this embodiment, the coolant flows through the housing 2. The shrinking bag 4 is generally made of elastic material and is provided inside the housing 2. The shrinking bag 4 adjusts the volume of the chamber by the elasticity of the shrinking bag 4. That is, when the temperature of the coolant increases, the internal pressure of the computer increases as well, and the internal pressure can be lowered by the coolant squeezing the shrinking bag 4. The shrinking bag 4 is in communication with the outside of the housing 2 (i.e., the outside atmosphere) through the vent hole 51. The volume of the shrinking bag 4 is dynamically changed according to the pressure of the liquid cooling system. When the temperature of the CPU increases, the temperature of the cooling system also increases which will result in the raise of the internal pressure of the liquid cooling system. According to the general rule, heat expands and cold contracts. The expansion of the coolant will squeeze the shrinking bag 4, so that volume of the shrinking bag 4 is compressed, the air inside the shrinking bag 4 will be squeezed out of the shrinking bag 4 and into outer atmosphere via the vent hole 51. When the temperature and the pressure decrease, the volume of the shrinking bag 4 recovers to its original volume (see FIGS. 3 and 4). That is, the pressure in the housing 2 is the same as the outside ambient pressure via the volume change of the shrinking bag 4 so that the problem of high-pressure caused liquid leakage is fundamentally solved.

In some embodiments, the shrinking device further includes a sleeve 3 that is inserted into the housing 2, and one end of the shrinking bag 4 is an open end having a sealing flange 41. The shrinking bag 4 is disposed within the housing 2 through the sleeve 3. A sealing nut 5 is screwed on the tail part of the sleeve 3 such that a sealing flange 41 abuts against the end face of the tail part of the sleeve 3, and is sealed by the sealing nut 5. The vent hole 51 is arranged on the end face of the sealing nut 5 (see FIG. 5). In an exemplary embodiment, the nut 5 is tightly sealed to enable firm sealing between the end part of the shrinking bag 4 and the tail part of the sleeve 3 to guarantee no coolant leakage.

In some embodiments, the housing 2 has a cylindrical shape (see FIG. 11), and the sleeve 3 is inserted in one end of the housing 2.

In some embodiments, the shrinking bag 4 extends along the length of the housing 2 after passing through the sleeve 3. In this example, the shrinking bag 4 can be made of soft and elastic rubber material. One end of the shrinking bag 4 is closed and the other end is open with the open end being provided with a sealing flange 41.

In some embodiments, a gap is provided between the shrinking bag 4 and the inner wall of the housing so as to mount the shrinking bag 4 into the housing 2.

In some embodiments, a protruded tube 53 is provided in the sealing nut 5. The vent hole 51 extends through the protruded tube 53, and the protruded tube 53 is inserted into the open end of the shrinking bag 4 (see FIG. 1).

Figure 5:
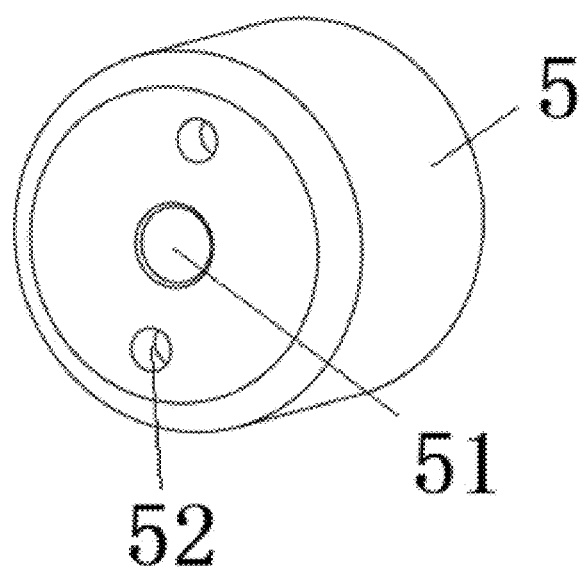
FIG. 5 is a schematic view showing the structure of a sealing nut of a liquid cooling system according to the present invention.
Figure 6:
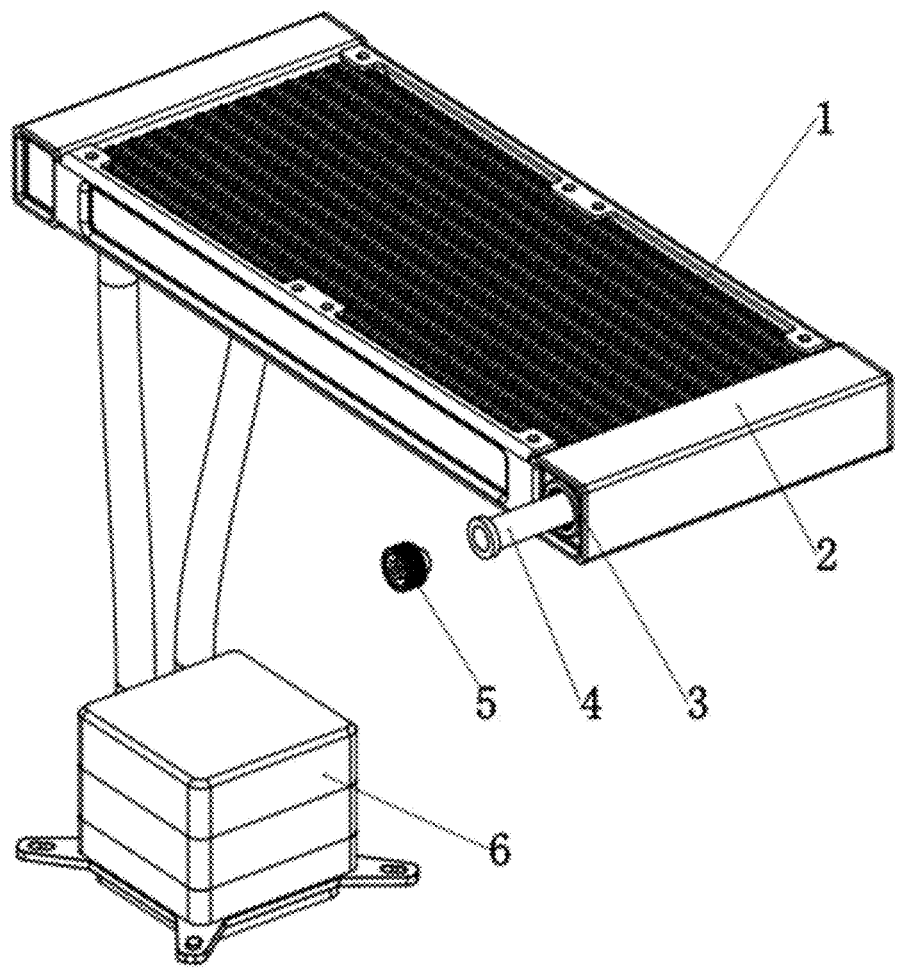
FIG. 6 is a schematic view showing the liquid cooling system according to an embodiment of the present invention.
Figure 7:
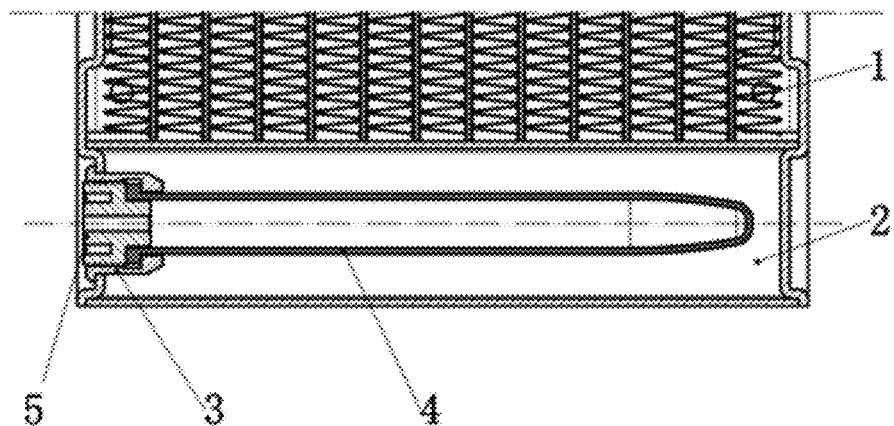
FIG. 7 is a schematic view showing a conventional state of the shrinking bag in the liquid cooling system according to another embodiment of the present invention.
Figure 8:
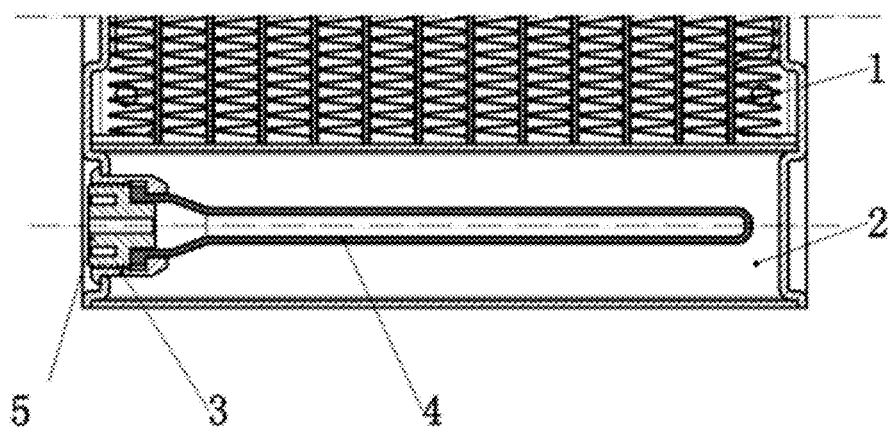
FIG. 8 is a schematic view showing a decompression state of the shrinking bag in the liquid cooling system according to another embodiment of present invention.
Figure 9:
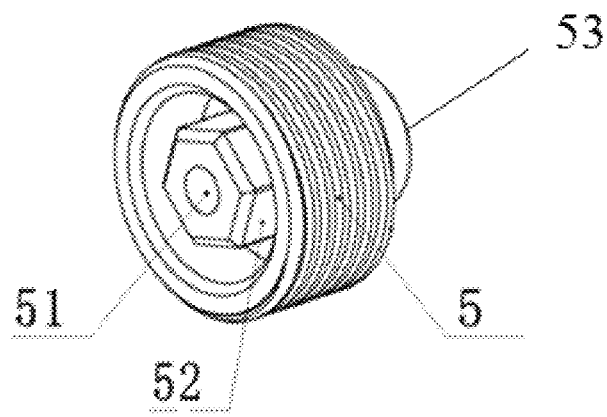
FIG. 9 is a schematic view showing the structure of another sealing nut of a liquid cooling system according to the present invention.

In some embodiments, the end face of the sealing nut 5 is provided with an opening hole 52. In this embodiment, in order to prevent the sealing nut 5 from being wrongly detached, as shown in FIG. 5, two opening holes 52 are provided on the end face and the sealing nut 5 can only be dismounted through a special tool. Preferably, as shown in FIG. 9, the opening hole 52 is annular.

Example 2

Figure 2:
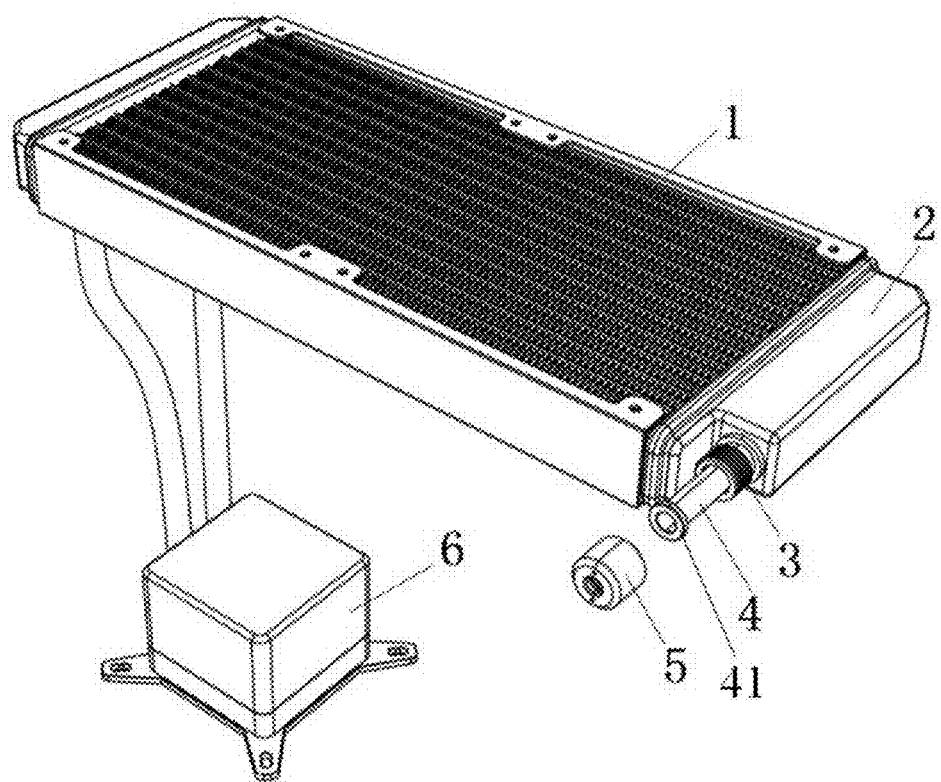
FIG. 2 is a schematic view showing the use of a shrinking device in a liquid cooling system according to the present invention.

As shown in FIG. 2, a CPU liquid cooling system according to an embodiment of the present invention includes a heat exchanger radiator 1, a cooling block 6 and a shrinking device. Coolant circulates through the heat exchanger radiator 1 to dissipate heat. The cooling block 6 is provided with a water pump, and the liquid cooling system absorbs heat through the cooling block 6 and transfers the heat to the heat exchanger radiator 1 through the water pump. The shrinking device includes a housing 2 having a chamber and at least one shrinking bag 4. A chamber is formed inside of the housing 2. Coolant flows through the chamber, and the housing 2 is in fluid communication with both the heat exchanger radiator 1 and the cooling block 6. The shrinking bag 2 has an open end 4a and a closed end 4b, the closed end being inserted into the chamber. The shrinking bag 4 is in communication with outside atmosphere through a vent hole 51. Different embodiments of the shrinking bag 4 described above can be applied to the CPU liquid cooling system according to an embodiment of the present application.

In an embodiment, the housing is in fluid communication with both the heat exchanger radiator and the cooling block the housing 2 and the heat exchanger radiator 1 are integrally formed, or the housing 2 is welded to one side of the heat exchanger radiator 1. When the housing 2 and the heat exchanger radiator 1 are integrally formed, the chamber of the housing 2 is configured for the coolant to circulate through, and the shrinking bag 4 is arranged in the housing 2, and the shrinking bag 4 is in communication with the outside of the housing 2 through a vent hole 51.

In an embodiment, the housing 2 and the heat exchanger radiator 1 are integrally formed. With one or more shrinking bags 4 provided in in the housing 2, the shrinking bag 4 is in communication with the outside of the housing 2 (i.e., the outside atmosphere) through the vent hole 51. The shrinking bag 4 is generally made of elastic material, and the volume is adjusted by the size of the inner diameter and the length of the shrinking bag. The volume of the shrinking bag 4 is dynamically adjusted according to the pressure of the whole liquid cooling system: when the temperature and the pressure increase, the volume of the shrinking bag 4 is compressed; and when the temperature and the pressure decrease, the volume recovers (see FIGS. 3 and 4). By balancing the pressure difference between the inside and the outside of the CPU liquid cooling system via the change in the volume of the shrinking bag, the problem of liquid leakage caused by excessive pressure inside the system can be fundamentally solved.

In some embodiments, the housing 2 is arranged along the width of one side of the heat exchanger radiator 1. In reality, the housing 2 can be arranged on any side of the heat exchanger radiator 1 as long as the coolant flowing direction is not disrupted. In an embodiment, the housing 2 may be designed to be a rectangular housing structure corresponding to the thickness of the heat exchanger radiator 1.

Figure 10:
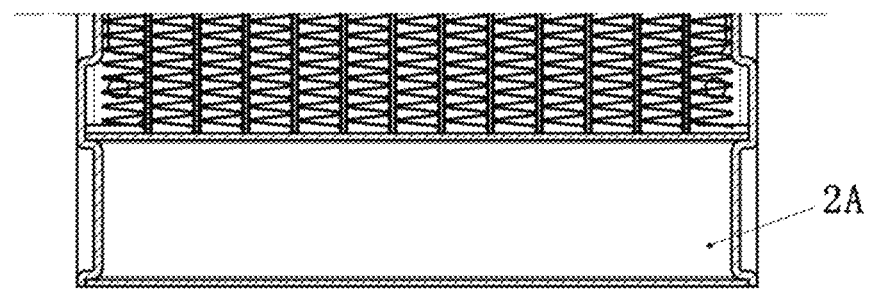
FIG. 10 is a schematic view showing the structure of a housing of an liquid cooling system.

In some embodiments, one end of the housing 2 is recessed into a side of the heat exchanger radiator 1 to form a mounting space for the shrinking device. As described above, when the shrinking bag 4 is provided on the housing 2 through the sleeve 3 and the sealing nut 5, the mounting space serves to receive the sealing nut 5 (see FIG. 4). In the embodiment, the shape of the housing 2 is different from that of the traditional housing 2A (see FIG. 10). The housing 2A has a length equivalent to the width of the heat exchanger radiator 1 since the traditional housing 2A is not provided with a sealing nut 5.

In some embodiments, the shrinking device further includes a sleeve 3 that is partially inserted into the housing 2, and one end of the shrinking bag 4 is an open end having a sealing flange 41. The shrinking bag 4 is disposed within the housing 2 through the sleeve 3. A sealing nut 5 is screwed on the tail part of the sleeve 3 such that a sealing flange 41 abuts against the end face of the tail part of the sleeve 3, and is sealed by the sealing nut 5. The vent hole 51 is arranged on the end face of the sealing nut 5 (see FIG. 5). In an exemplary embodiment, the nut 5 is tightly sealed to enable firm sealing between the end part of the shrinking bag 4 and the tail part of the sleeve 3 to guarantee no coolant leakage.

Example 3

As shown in FIGS. 6 to 9, a CPU liquid cooling system according to another embodiment of the present invention is showed. In some embodiments, the sleeve 3 is fully inserted into the housing 2, which is different from the embodiments described above. Besides, the length of the housing 2 is substantially same as the width of the heat exchanger radiator 1.

Example 4

Figure 11:
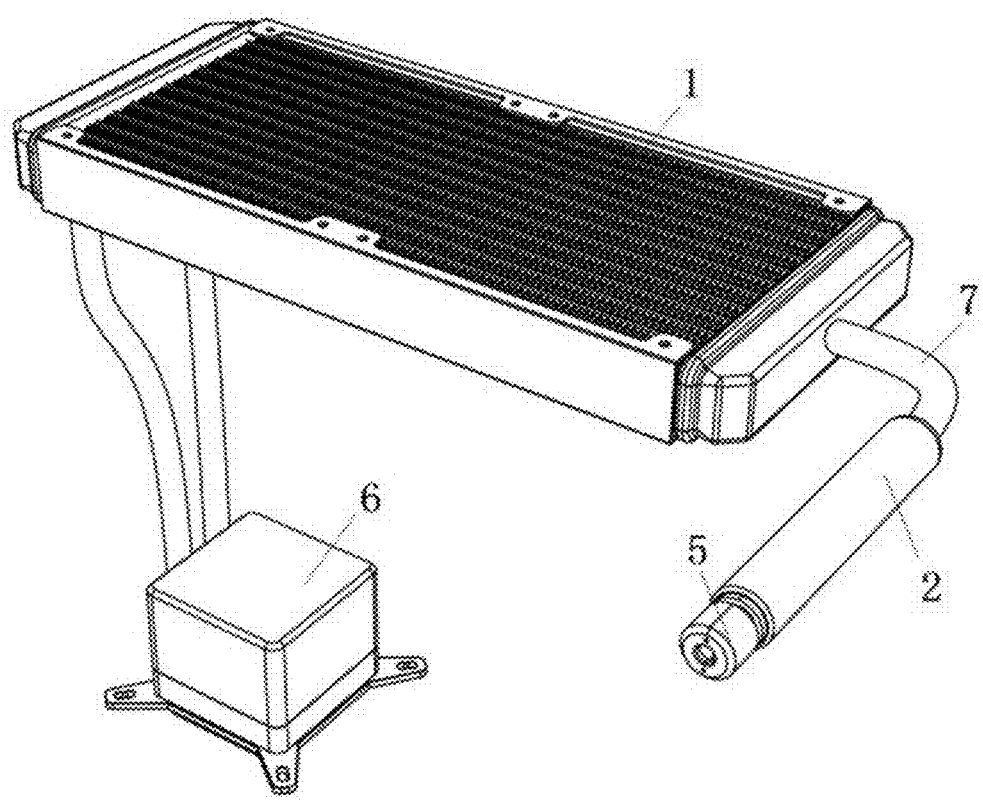
FIG. 11 is a schematic view showing a liquid cooling system according to an embodiment of the present invention.
Figure 12:
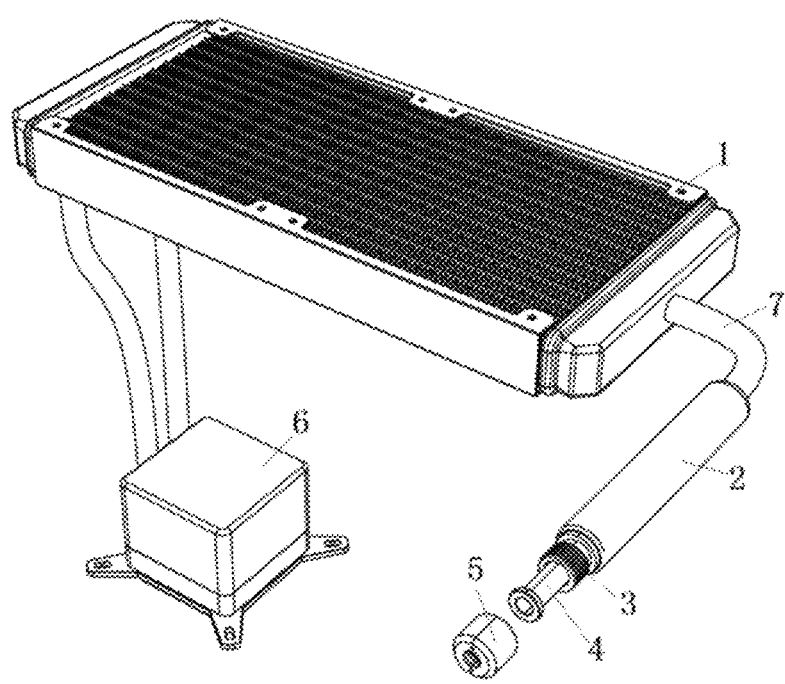
FIG. 12 is a schematic view showing the structure of a liquid cooling system according to another embodiment of the present invention.

As shown in FIGS. 11 and 12, the present embodiment differs from the foregoing embodiments in that the housing 2 is constructed as a separate component, and the housing 2 is in fluid communication with the heat exchanger radiator 1 through a connection tube 7. That is to say, the housing 2 is not directly coupled to or integrally formed with the heat radiator 1. It can be seen from FIGS. 11 and 12 that only the arrangement of housing 2 is different from the foregoing embodiments. Certainly, the shape of the housing 2 can be changed, as long as a certain accommodating space is provided inside it. The shrinking bag 4 is provided in the same manner as the forgoing embodiments, so it will not be described in detail herein.

Example 5

Figure 13:
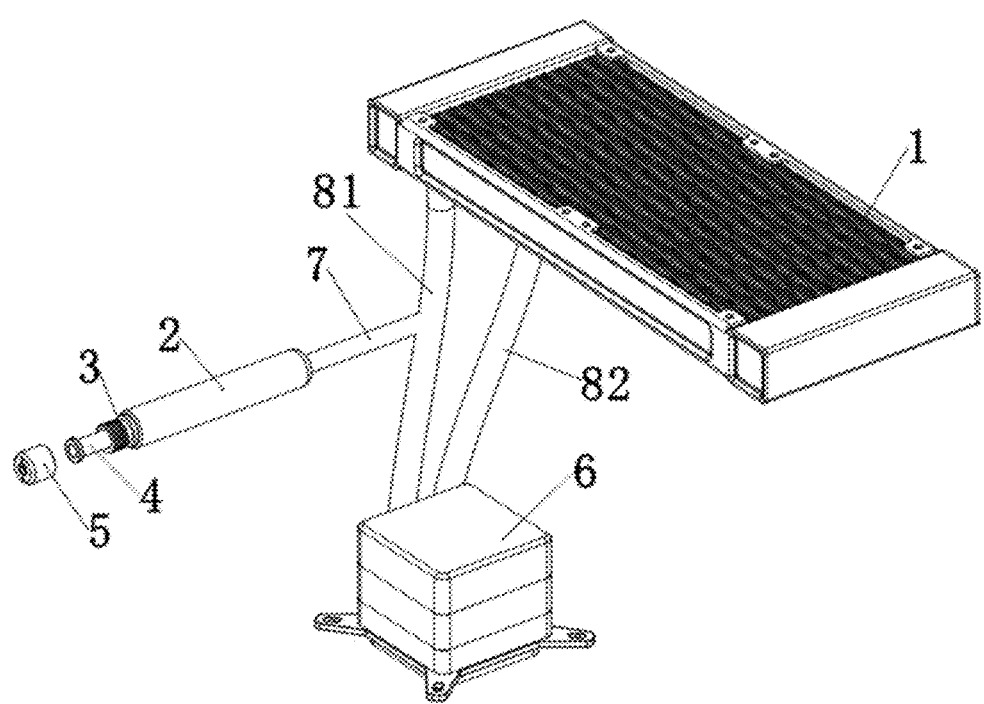
FIG. 13 is a schematic view showing the structure of a liquid cooling system according to another embodiment of the present invention.
Figure 14:
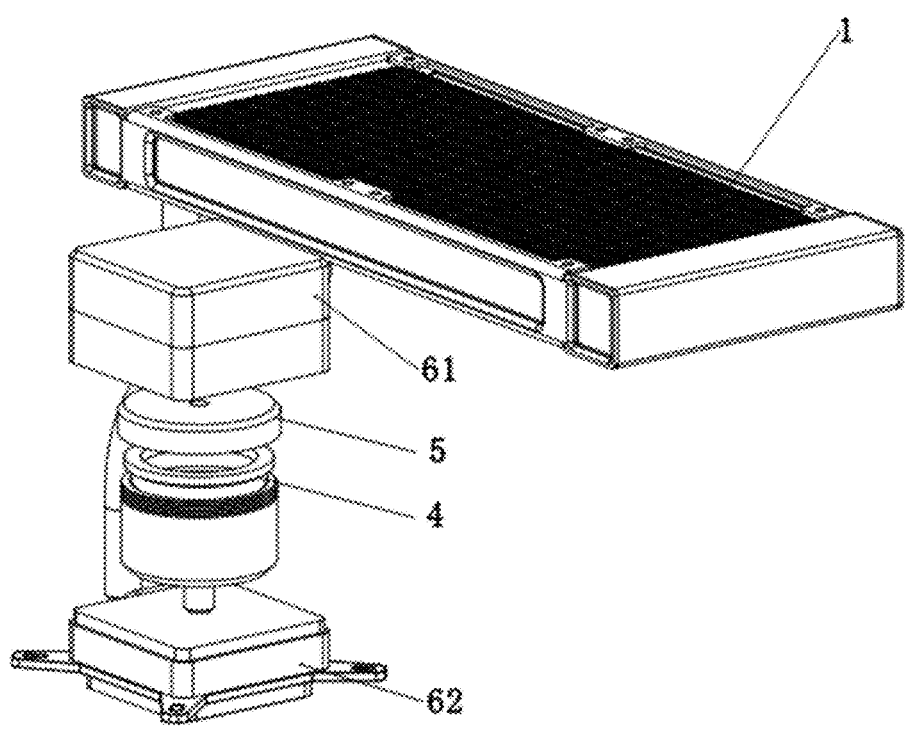
FIG. 14 is a schematic view showing the structure of a liquid cooling system according to another embodiment of the present invention.
Figure 15:
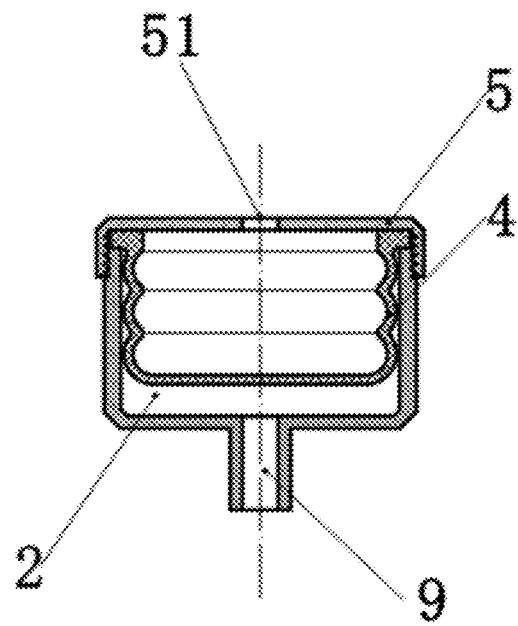
FIG. 15 is a schematic view showing the normal state of the shrinking device according to another embodiment of the present invention.
Figure 16:
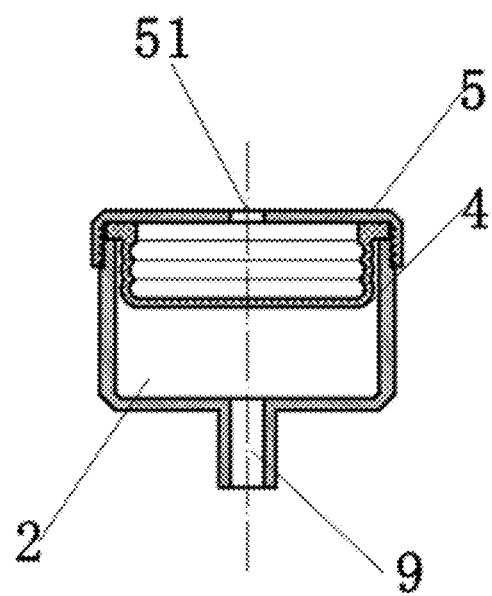
FIG. 16 is a schematic view showing the decompression state of the shrinking device according to another embodiment of the present invention.

As shown in FIG. 13, a liquid cooling system of the present embodiment includes a heat exchanger radiator 1, a cooling block 6, and a shrinking device. A coolant inlet pipe 81 and a coolant outlet pipe 82 are arranged between the heat exchanger radiator 1 and the cooling block 6, and the housing 2 is in fluid communication with the coolant inlet pipe 81 or the coolant outlet pipe 82 through a connection tube 7. That is to say, the shrinking device is arranged between the heat exchanger radiator 1 and the cooling block 6 and is arranged as a separate component. Compared with the forgoing embodiments, only the position of the housing 2 of the shrinking device is different, but certainly the shape of the housing in this example can be changed as long as a certain accommodating space is provided inside it. The shrinking bag 4 is provided in the same manner as other embodiments. So it will not be described in detail herein.

Example 6

As shown in FIGS. 13 to 16, a liquid cooling system of the present embodiment includes a heat exchanger radiator 1, a cooling block 6, a shrinking device, and a water pump (not shown). Preferably, the shrinking device is disposed within the cooling block 6 between an upper cooling block housing 61 and a lower cooling block housing 62. A housing 2 of the shrinking device is in fluid communication with the water pump, and a shrinking bag 4 is in communicated with the outside of the housing 2 (i.e., with the outside atmosphere) through a vent hole 51. The housing 2 includes a connection portion 9 in fluid communication with the interior of the water pump. One end of the shrinking bag 4 is an open end arranged with a sealing nut 5, and the sealing nut 5 is in threaded connection with the outside of the housing 2, and the vent hole 51 is arranged on the end face of the sealing nut 5. When the internal pressure of the system increases, the volume of the area communicated with the internal waterway increases, and correspondingly the part communicated with the external atmosphere is reduced. The pressure difference between the inside and the outside of the system can be balanced via the change in the volume of the shrinking bag 4.

In summary, according to various embodiments of the present invention, when the internal pressure of the system is excessive, the internal volume is expanded by squeezing the shrinking bag, so that the increased pressure is released and the problem of liquid leakage caused by high-pressure is fundamentally solved.

The foregoing description of specific exemplary embodiments of the present invention has been presented for purposes of illustration and example. The descriptions are not intended to limit the invention to the precise form as disclosed, and obviously many modifications and variations are possible in light of the above teachings. The exemplary embodiments are chosen and described in order to explain the particular principles of the invention and its practical application to thereby enable those skilled in the art to implement and utilize various exemplary embodiments of the invention and various alternatives and modifications. It is intended that the scope of the invention are defined by the claims and equivalents thereof.

The invention claimed is:

1. A shrinking device for a liquid cooling system, comprising:
 a housing having a chamber therein, wherein a coolant flows through the chamber;

at least one shrinking bag having an open end and a closed end, the closed end being inserted into the chamber, and the shrinking bag being in communication with outside atmosphere through a vent hole;

a sealing member provided at the open end of the shrinking bag and mounted to the housing, wherein the sealing member is provided with the vent hole such that the shrinking bag is in communication with outside atmosphere through the vent hole; and a sleeve sealingly connected to the housing and to the sealing member, and wherein the shrinking bag is disposed into the chamber through the sleeve.

2. The shrinking device for the liquid cooling system according to claim 1, wherein an end face of the open end of the shrinking bag is provided with a sealing flange which abuts against an end face of the sleeve.

3. The shrinking device for the liquid cooling system according to claim 1, wherein the sleeve and the sealing member are sealingly connected through screw thread.

4. The shrinking device for the liquid cooling system according to claim 1, wherein the housing has a cylindrical shape, and the shrinking bag extends along the length of the housing.

5. The shrinking device for the liquid cooling system according to claim 1, wherein the sealing member has a protruded tube, wherein the vent hole extends through the protruded tube, and the protruded tube is inserted into the open end of the shrinking bag.

6. A liquid cooling system, comprising:
a heat exchanger radiator through which a coolant dissipates heat;
a cooling block, wherein the liquid cooling system absorbs heat through the cooling block and transfers the heat to the heat exchanger radiator; and
a shrinking device, comprising:
a housing having a chamber therein, wherein coolant flows through the chamber;
wherein the coolant flows through the chamber, and the housing is in fluid communication with both the heat exchanger radiator and the cooling block;
at least one shrinking bag having an open end and a closed end, the closed end being inserted into the chamber, and the shrinking bag being in communication with outside atmosphere through a vent hole;
a sealing member provided at the open end of the shrinking bag and mounted to the housing, wherein the sealing member is provided with the vent hole such that the shrinking bag is in communication with outside atmosphere through the vent hole; and
a sleeve sealingly connected to the housing and to the sealing member, and wherein the shrinking bag is disposed into the chamber through the sleeve.

7. The liquid cooling system according to claim 6, wherein an end face of the open end of the shrinking bag is provided with a sealing flange which abuts against an end face of the sleeve.

8. The shrinking device for the liquid cooling system according to claim 7, wherein the sleeve and the sealing member are sealingly connected through screw thread.

9. The liquid cooling system according to claim 6, wherein the housing has a cylindrical shape, and the shrinking bag extends along the length of the housing.

10. The liquid cooling system according to claim 6, wherein the sealing member has a protruded tube, wherein the vent hole extends through the protruded tube, and the protruded tube is inserted into the open end of the shrinking bag.

11. The liquid cooling system according to claim 6, wherein the housing is disposed onto the heat exchanger radiator and is integrally formed with the heat exchanger radiator.

12. The liquid cooling system according to claim 11, wherein the housing is arranged along one side of the heat exchanger radiator in a width direction of the heat exchanger radiator.

13. The liquid cooling system according to claim 6, wherein a coolant passage is provided on one side of the heat exchanger radiator in a width direction thereof, and the housing is in fluid communication with the coolant passage through a separate connection tube.

14. The liquid cooling system according to claim 6, wherein a coolant inlet pipe and a coolant outlet pipe are provided between the heat exchanger radiator and the cooling block, wherein the housing is in fluid communication with the coolant inlet pipe or the coolant outlet pipe through a separate connection tube.

15. The liquid cooling system according to claim 6, wherein the housing is disposed within the cooling block.

16. The liquid cooling system according to claim 14, wherein the housing comprises a connection portion in fluid communication with the water pump.

* * * * *